United States Patent [19]
Park et al.

[11] Patent Number: 6,107,640
[45] Date of Patent: *Aug. 22, 2000

[54] SEMICONDUCTOR DEVICE FOR A THIN FILM TRANSISTOR

[75] Inventors: Jae-Yong Park, Kyungki-do; Jae-Kyun Lee; Jung-Hoan Kim, both of Pusan-si, all of Rep. of Korea

[73] Assignee: LG Electronics Inc., Seoul, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/832,692

[22] Filed: Apr. 11, 1997

[30] Foreign Application Priority Data

Jul. 2, 1996 [KR] Rep. of Korea ............. 96-26676

[51] Int. Cl.$^7$ ................ H01L 29/04; H01L 27/01
[52] U.S. Cl. ............... 257/59; 257/61; 257/72; 257/347; 349/43
[58] Field of Search ............ 257/359, 72, 57, 257/61, 347; 349/42, 43

[56] References Cited

U.S. PATENT DOCUMENTS

| | | | |
|---|---|---|---|
| 5,334,860 | 8/1994 | Naito | 257/59 |
| 5,614,731 | 3/1997 | Uchikoga et al. | 257/59 |
| 5,641,974 | 6/1997 | Den Boer et al. | 257/59 |
| 5,712,494 | 1/1998 | Akiyama et al. | 257/59 |
| 5,719,078 | 2/1998 | Kim | 257/59 |

FOREIGN PATENT DOCUMENTS

| | | |
|---|---|---|
| 0 273 743 | 7/1986 | European Pat. Off. . |
| 0 449 539 | 10/1991 | European Pat. Off. . |
| 0 476 701 | 3/1992 | European Pat. Off. . |
| 0473988 | 3/1992 | European Pat. Off. . |
| 0530834 | 3/1993 | European Pat. Off. . |
| 96-17813 | 6/1996 | Rep. of Korea . |
| 97-76040 | 12/1997 | Rep. of Korea . |
| 9206505 | 4/1992 | WIPO . |

*Primary Examiner*—Minh Loan Tran
*Attorney, Agent, or Firm*—Finnegan, Henderson, Farabow, Garrett & Dunner, L.L.P.

[57] ABSTRACT

A semiconductor device for a TFT includes a first semiconductor layer to be used as a channel, which is formed on a portion of an insulating layer in correspondence with an underlying gate electrode. The semiconductor device further includes a second semiconductor layer, an ohmic contact layer, and a metal layer formed on the insulating layer and the first semiconductor layer and patterned to expose portions of the insulating layer and the first semiconductor layer. The patterned metal layer forms source and drain electrodes. The semiconductor device also includes a passivation layer, which covers the insulating layer, the first semiconductor layer and the source and drain electrodes, and a pixel electrode, which contacts the drain electrode though a contact hole in the passivation layer.

11 Claims, 2 Drawing Sheets

SEMICONDUCTOR DEVICE FOR A THIN FILM TRANSISTOR

BACKGROUND OF THE INVENTION

1. Field of the Invention

The present invention relates to a method of fabricating a thin film transistor (TFT) of an active matrix liquid crystal display (LCD) and a related TFT structure. More particularly, the present invention is directed to a method of fabricating a TFT in which a semiconductor layer and ohmic contact layer are formed successively so as to prevent a native oxide layer from being formed therebetween, and in which the semiconductor layer, as well as source and drain electrodes, are patterned using a single mask in order to reduce the number of masking steps.

2. Discussion of Related Art

An active matrix LCD includes a matrix of pixels, each having a TFT switching element and associated pixel electrode electrically connected to the TFT. The TFT may have either a coplanar or staggered structure. The staggered type TFT utilizes amorphous silicon as its semiconductor layer and can therefore be manufactured at temperatures below 300° C., which is lower than the temperature required to fabricate a coplanar polysilicon TFT. Accordingly, the staggered TFT can be fabricated on an inexpensive glass substrate.

There are two types of staggered TFT's; reverse stagger type and regular stagger type TFTs. In the reverse stagger type TFT, the gate electrode is formed under the semiconductor layer; while the gate electrode of the regular stagger type TFT is formed on the semiconductor layer. The reverse stagger type TFT is widely used because the amorphous silicon is damaged less during the layer deposition step of the TFT fabricating process, and its electron mobility is relatively high.

There are two kinds of reverse stagger type TFT's as well; back channel etched (BCE) type and etch stopper (ES) type. During manufacture of the BCE type TFT, when a heavily doped amorphous silicon ohmic contact layer is removed using source and drain electrodes as a mask, the semiconductor layer may be damaged. On the other hand, the ES type TFT has an etch stop layer so that its ohmic contact layer can be easily removed without damaging the surface of the semiconductor layer.

FIGS. 1A to 1D are cross-sectional views showing a conventional process for fabricating an etch stopper type TFT. As shown in FIG. 1A, a metal is deposited on a transparent insulating substrate 11 through a sputtering method and patterned by conventional photolithography to form gate electrode 13. The metal is preferably selected from the group of aluminum (Al), aluminum alloy, molybdenum (MO), molybdenum alloy, titanium (Ti), titanium alloy, tantalum (Ta), tantalum alloy, cobalt (Co) and cobalt alloy. Silicon oxide or silicon nitride is then deposited on the surface of the gate electrode 13 and substrate 11 in a single layer or a double layer of the two dielectrics, to form an insulating layer 15.

Referring to FIG. 1B, undoped amorphous silicon is deposited on insulating layer 15 to form a semiconductor layer 17. Silicon oxide or silicon nitride is next deposited on semiconductor layer 17 to form an etch stop layer 19, followed by a photoresist layer coating (not shown). Then, the photoresist is back-etched and developed using the gate electrode 13 as a mask, such that only a portion of the photoresist layer remains covering part of semiconductor layer 17 corresponding to gate electrode 13. Thereafter, the etch stop layer 19 is selectively etched using the photoresist as a mask, thereby exposing a portion of the semiconductor layer 17. The photoresist is then removed.

Referring to FIG. 1C, a heavily doped amorphous silicon layer is deposited on the semiconductor layer 17 and an etch stop layer 19. The heavily doped amorphic silicon layer is patterned by photolithography to form ohmic contact layer 21. Semiconductor layer 17 is also patterned in this photolithography step. A conductive metal, such as aluminum, is then deposited on insulating layer 15 and ohmic contact layer 21, and patterned to form source and drain electrodes 23 and 25, respectively. An exposed portion of the ohmic contact layer 21 is next etched using the source and drain electrodes 23 and 25 as a mask. Here, over-etching is carried out in order to prevent a portion of the ohmic contact layer from remaining on the etch stop layer 19. Accordingly, the etch stop layer 19 prevents the surface of the semiconductor layer 17 from being damaged during the over-etching.

As seen in FIG. 1D, silicon oxide or silicon nitride is deposited on the substrate by chemical vapor deposition (CVD), to form a passivation layer 27. Next, a portion of passivation layer 27 is selectively removed in order to form a contact hole 28 exposing a predetermined portion of the drain electrode. A transparent conductive material is then deposited on the passivation layer 27 and patterned to form a pixel electrode 29, while electrically connected to drain electrode 25 through contact hole 28.

In the conventional method of fabricating TFT described above, the source and drain electrodes are formed on a portion of the ohmic contact layer other than a portion corresponding to the gate electrode, and the ohmic contact layer is removed by an over-etching process using the source and drain electrodes as a mask. Thus, damage to the semiconductor layer is minimized. However, since the semiconductor layer and source and drain electrodes are respectively patterned using different masks, the number of masking steps is increased. Furthermore, the semiconductor layer and ohmic contact layer are not formed successively. Accordingly, an additional step is required to remove a native oxide layer formed between these two layers.

SUMMARY OF THE INVENTION

The present invention is directed to a method of fabricating a TFT that substantially obviates one or more of the problems caused by limitations and disadvantages of the conventional TFT fabrication process described above.

An object of the present invention is to provide a method of fabricating a TFT in which a semiconductor layer and ohmic contact layer are formed successively so that a native oxide layer does not form therebetween.

Another object of the present invention is to provide a method of fabricating a TFT in which a semiconductor layer and source and drain electrodes are patterned using a single mask so as to reduce the total number of mask steps required to fabricate the TFT.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof, as well as the appended drawings.

To achieve these and other advantages and in accordance with the purpose of the present invention, as embodied and broadly described, the method of fabricating a thin film transistor, comprises the steps of forming a gate electrode on a predetermined portion of a transparent insulating substrate; forming an insulating layer on the substrate and gate electrode; forming a first semiconductor layer on a portion of the insulating layer corresponding to the gate electrode; successively forming a second semiconductor layer, a heavily doped first conductivity type ohmic contact layer and conductive metal layer on the insulating layer and first semiconductor layer; patterning the conductive metal layer to form source and drain electrodes; and removing an exposed portion of the ohmic contact layer and second semiconductor layer, thereby exposing a portion of the insulating layer and first semiconductor layer; forming a passivation layer on the insulating layer and first semiconductor layer, thereby covering the source and drain electrodes; forming a contact hole through the passivation layer in order to expose a predetermined portion of the drain electrode; and forming on the passivation layer a pixel electrode electrically connected to the drain electrode through the contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
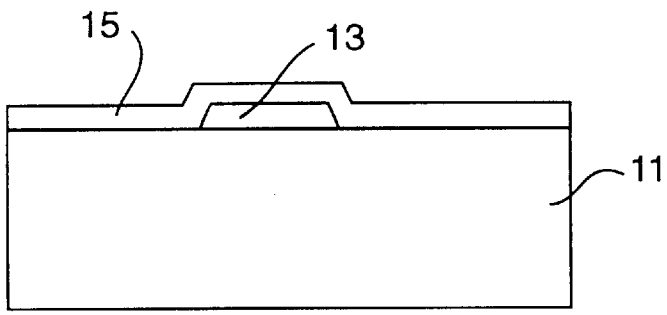
FIGS. 1A to 1D are cross-sectional views of a TFT at various stages of a conventional fabrication process.
Figure 1B:
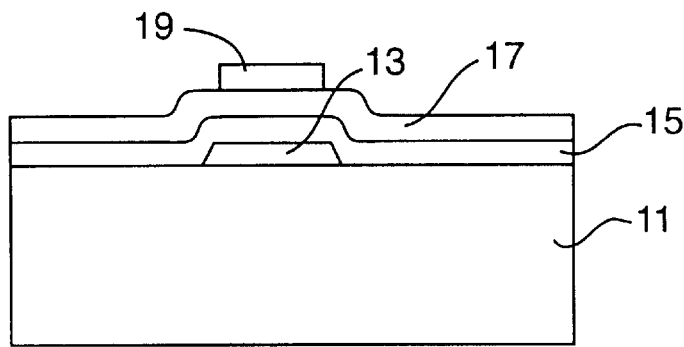
Figure 1C:
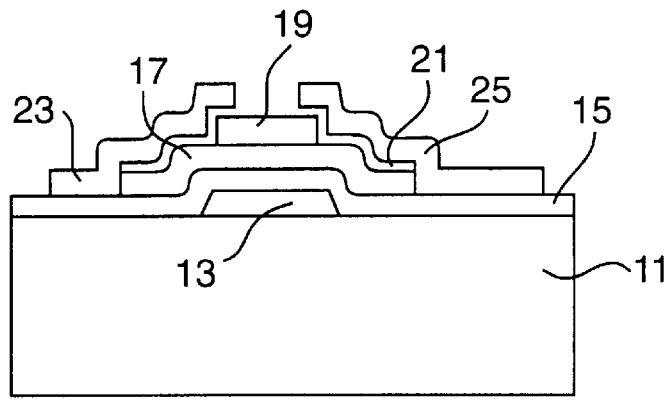
Figure 1D:
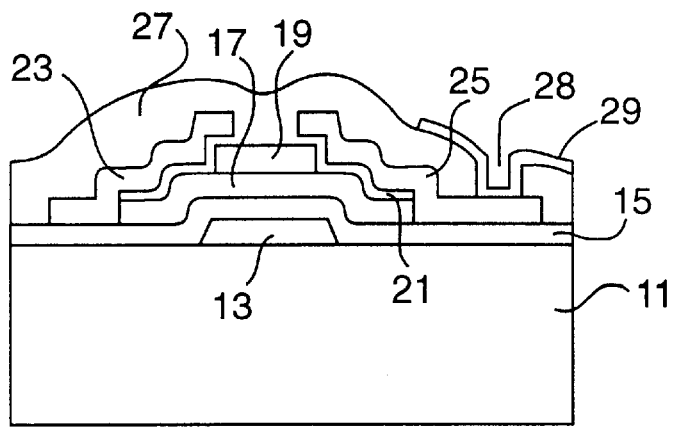
Figure 2A:
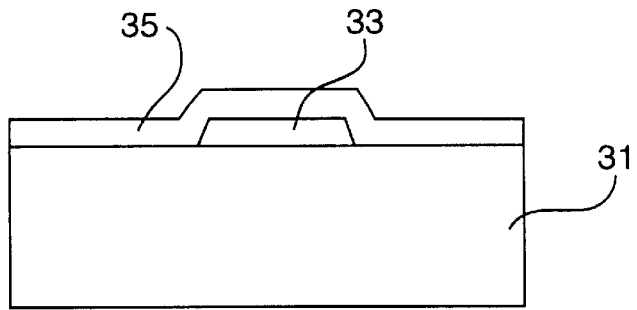
FIGS. 2A to 2D are cross-sectional views showing a process of fabricating a TFT in accordance with the present invention.

FIGS. 2A to 2D are cross-sectional views of a TFT at various stages of a fabrication process. Referring to FIG. 2A, a conductive metal layer, typically selected from the group of aluminum (Al), aluminum alloy, molybdenum (Mo), molybdenum alloy, titanium (Ti), titanium alloy, tantalum (Ta, tantalum alloy, cobalt (Co) and cobalt alloy, is deposited to a thickness of 2000 to 3000 Å on a transparent insulating substrate 31, e.g, glass, by a sputtering process. The conductive metal layer is then patterned using conventional photolithographic techniques to form a gate electrode 33. Silicon oxide or silicon nitride is next deposited to a thickness of 3000 to 4000 Å on the surface of the gate electrode 33 and substrate 31 using a CVD process to form a single insulating layer 35. Alternatively, insulating layer 35 can include a double layer structure formed by the successive deposition of the two dielectrics.

Figure 2B:
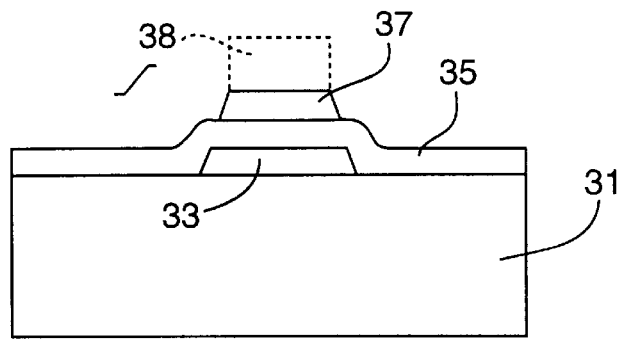

As seen in FIG. 2B, undoped amorphous silicon is deposited to a thickness of 500 to 1500 Å on the insulating layer 35 using another CVD process to form a first semiconductor layer 37. A photoresist 38 is then coated on the first semiconductor layer 37, back exposed, and developed using the gate electrode 33 as a mask, thereby leaving only a portion of the photoresist layer 38 on the first semiconductor layer 37, positioned in correspondence with the gate electrode 33. Next, first semiconductor layer 37 is dry-etched using the photoresist 38 as a mask so as to expose a portion of the insulating layer 35. Thereafter, the photoresist 38 is removed. Portions of the first semiconductor layer 37 remaining after the dry etch are used as a channel in the completed device.

Figure 2C:
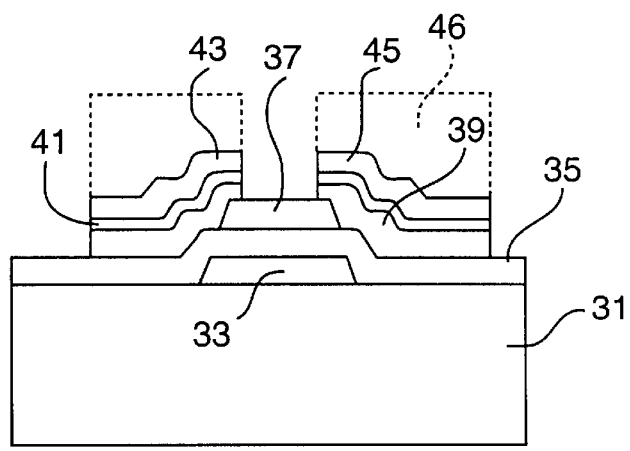

As shown in FIG. 2C, an undoped amorphous silicon second semiconductor layer 39 and an amorphous silicon heavily doped N-type ohmic contact layer 41 are successively deposited on the insulating layer 35 and first semiconductor layer 37. Typically, the undoped amorphous silicon is deposited to a thickness of 1500 to 2000 Å, and the heavily doped amorphous silicon is deposited to a thickness of 500 to 1000 Å. Generally, second semiconductor layer 39 and ohmic contact layer 41 are successively deposited inside a single reaction chamber. In accordance with one aspect of the present invention, undoped amorphous silicon 39 can be formed by flowing appropriate gases into the reaction chamber, and doped amorphous silicon 41 can be subsequently formed by introducing a dopant gas into the chamber without interrupting the gas flow. Thus, a native oxide layer is not formed therebetween.

Thereafter, a conductive metal such as aluminum or chrome is deposited to a thickness of 2000 to 3000 Å on the ohmic contact layer 41. A photoresist 46 is next coated on the metal layer, followed by exposure and development to form a photoresist pattern. The metal layer is wet-etched, using the photoresist pattern 46 as a mask, to form source and drain electrodes 43 and 45, respectively. The ohmic contact layer 41 and second semiconductor layer 39 are then removed using the same photoresist pattern mask 46 thereby exposing portions of the insulating layer 35 and first semiconductor layer 37. Thereafter, the photoresist pattern 46 on the source and drain electrodes is removed. Alternatively, the photoresist pattern 46 can be removed after the step of patterning the source 43 and drain 45 electrodes. In which case, the source 43 and drain 45 electrodes can serve as a mask. In removing the ohmic contact layer 41 and second semiconductor layer 39, the source and drain electrodes may be used as a mask. Here, first semiconductor layer 37 is left even if exposed portions of the second semiconductor layer 39 are fully removed. Accordingly, the first semiconductor layer 37 remains as a channel connecting the source 43 and drain 45 electrodes to each other.

Figure 2D:
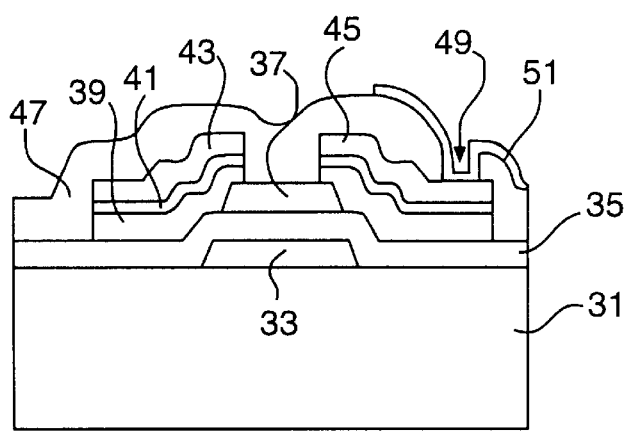

As shown in FIG. 2D, silicon oxide or silicon nitride is deposited to a thickness of 3000 to 4000 Å on the insulating layer 35, source electrode 43, drain electrode 45, and first semiconductor layer 37 using a CVD process, to form a passivation layer 47. A portion of passivation layer 47 are then selectively removed in order to expose a predetermined portion of the drain electrode 45, thereby forming a contact hole 49. Thereafter, a transparent conductive material, such as indium tin oxide (ITO) or $SnO_2$ is deposited to a thickness of 300 to 800 Å on the passivation layer 47 using a sputtering technique. Next, selection portions of the conductive material layer overlying the gate electrode 33 and source electrode 43 are removed by first performing a photolithography step, followed by a wet etch, thereby patterning the conductive layer to form pixel electrode 51. The pixel electrode 51 is electrically connected to drain electrode 45 through contact hole 49. The completed TFT in accordance with the present invention is thus formed as shown in FIG. 2D.

As described above, in the method of fabricating a TFT in accordance with the present invention, the first semiconductor layer 37 to be used as a channel is formed on a portion of the insulating layer 35 in correspondence with an underlying gate electrode 33. The second semiconductor layer 39, ohmic contact layer 41 and metal layer 45 are then successively formed on the insulating layer 35 and first semiconductor layer 37. A photoresist pattern is next formed on a portion of the ohmic contact layer other than a portion corresponding to the gate electrode. The metal layer is patterned using the photoresist pattern to form the source 43 and drain 45 electrodes, and the ohmic contact layer 41 and second semiconductor layer 39 are removed using the photoresist pattern as a mask, or using the source and drain electrodes as a mask after the removal of the photoresist pattern. Accordingly, the insulating layer and first semiconductor layer are exposed.

According to the present invention, since the first semiconductor layer 37 is formed on a portion of the insulating layer 35 in correspondence with gate electrode 33, and then the second semiconductor layer 39 and ohmic contact layer 41 are formed successively, a native oxide layer is not formed between the second semiconductor layer 39 and ohmic contact layer 41. Furthermore, the second semiconductor layer 39 and source 43 and drain 45 electrodes are patterned using a single mask, resulting in reduction of the number of total masks necessary to fabricate the TFT.

It will be apparent to those skilled in the art that various modifications and variations can be made in the method of fabricating a thin film transistor of the present invention without departing from the spirit or scope of the invention. For example, although the present invention has been described above with reference to a TFT and related manufacturing process, the present invention is also applicable to any semiconductor device, such as those formed of single crystal silicon, as well as devices based on III-V and other compound semiconductors. Thus, it is intended that the present invention cover the modifications and variations of this invention provided they come within the scope of the appended claims and their equivalents.

Although the present invention has been described above with reference to a TFT and related manufacturing process, the present invention is also applicable to any semiconductor device, such as those formed on single crystal silicon, as well as device based on III-V and other compound semiconductor.

What is claimed is:

1. A semiconductor device comprising:
   a substrate;
   an electrode formed on a first portion of said substrate;
   an insulation layer formed on said electrode and second portions of said substrate other than said first portion;
   a first semiconductor material layer deposited on said insulation layer in correspondence with said electrode during a first deposition process, said first semiconductor material layer being substantially undoped and having a single first semiconductor material with homogeneous properties throughout the first semiconductor material layer;
   second semiconductor material layer portions deposited on said insulation layer in correspondence with said second portions of said substrate during a second deposition process, the first and second deposition processes resulting in a structure such that the first semiconductor material layer and the second semiconductor material layer portions are not unitary; and
   third semiconductor material layer portions formed on said second semiconductor material layer portions.

2. A semiconductor device in accordance with claim 1, wherein said second semiconductor layer portions are substantially undoped, and said third semiconductor layers are doped.

3. A semiconductor device in accordance with claim 2, wherein said third semiconductor layer portions constitute ohmic contacts.

4. A semiconductor device in accordance with claim 1, further comprising conductive layer portions formed on said third semiconductor layer portions.

5. A semiconductor device in accordance with claim 4, wherein said electrode is a gate electrode, and said second conductive layer portions include source and drain regions.

6. A semiconductor device in accordance with claim 4, further comprising:
   a passivation layer formed on said conductive layer portions, said passivation layer having a contact hole exposing part of one of said conductive layer portions; and
   a transparent electrode provided on said passivation layer, said transparent electrode electrically contacting said exposed part of one of said conductive layer portions through said contact hole.

7. A semiconductor device in accordance with claim 1, wherein said substrate is substantially transparent.

8. A semiconductor device in accordance with claim 1, wherein said electrode includes a gate electrode of a transistor.

9. A semiconductor device in accordance with claim 1, wherein at least part of the first semiconductor material layer is disposed in a first plane and at least part of each of the second semiconductor material layer portions is disposed in a plane different from the first plane.

10. A semiconductor device comprising;
    a substrate;
    an electrode formed on a first portion of said substrate;
    an insulation layer formed on said electrode and second portions of said substrate other than said first portion;
    a first semiconductor material layer formed on said insulation layer in correspondence with said electrode;
    second semiconductor material layer portions formed on said insulation layer in correspondence with said second portions of said substrate and partially overlapping said first semiconductor material layer; and
    third semiconductor material layer portions formed on said second semiconductor material layer portions.

11. A semiconductor device comprising;
    a substrate;
    an electrode formed on a first portion of said substrate;
    an insulation layer formed on said electrode and second portions of said substrate other than said first portion;
    a first semiconductor material layer formed on said insulation layer in correspondence with said electrode, said first semiconductor material layer being substantially undoped and having a single first semiconductor material with homogeneous properties throughout the first semiconductor material layer;
    second semiconductor material layer portions formed on said insulation layer in correspondence with said second portions of said substrate, partially overlapping said first semiconductor material layer and having a thickness greater than said first semiconductor material layer; and
    third semiconductor material layer portions formed on said second semiconductor material layer portions.

* * * * *